United States Patent [19]
Khaled et al.

[11] Patent Number: 5,416,804
[45] Date of Patent: May 16, 1995

[54] DIGITAL SIGNAL DECODER USING CONCATENATED CODES

[75] Inventors: Fazel Khaled, Epinay/Orge; Antoine Chouly, Paris, both of France

[73] Assignee: U.S. Philips Corporation, New York, N.Y.

[21] Appl. No.: 931,239

[22] Filed: Aug. 17, 1992

[30] Foreign Application Priority Data

Aug. 21, 1991 [FR] France ................... 91 10482

[51] Int. Cl.⁶ ................... H03D 1/00; H0HL 27/06
[52] U.S. Cl. ................... 375/341; 375/262; 371/37.4; 341/94; 348/466
[58] Field of Search ................... 375/39, 80, 94, 60; 371/37.4, 47.1; 370/20; 341/9, 94; 348/466

[56] References Cited

U.S. PATENT DOCUMENTS

| | | | |
|---|---|---|---|
| 4,646,301 | 2/1987 | Okamoto et al. | 371/37.4 |
| 4,653,052 | 3/1987 | Doi et al. | 371/37.4 |
| 5,029,185 | 7/1991 | Wei | 375/39 |
| 5,224,104 | 6/1993 | Weng | 371/37.4 |
| 5,233,629 | 8/1993 | Paik et al. | 375/39 |

FOREIGN PATENT DOCUMENTS

| | | |
|---|---|---|
| 0413505 | 8/1990 | European Pat. Off. . |
| 413505 | 2/1991 | European Pat. Off. . |

OTHER PUBLICATIONS

Branka Vucetic, "Bandwidth Efficient Concatenated Coding Schemes for Fading Channels", Jan. 1993, pp. 50–61.
IEEE Journal on Selected Areas in Communications, vol. 11, No. 1, Jan. 1993, pp. 111–118, Heegard et al., "Practical Coding for QAM Transmission of HDTV".
1990 IEEE, pp. 106–110, Gulliver, "Diversity Combining and Reed–Salomon Coding for Fast Frequency Hopped Noncoherent MFSK".
G. J. Pottie et al., "Multilevel Codes Based on Partitioning", IEEE Trans. on Information Theory, vol. 35, No. 1, Jan. 1989, pp. 87–89.
G. Ungerboeck, "Channel Coding with Multilevel/Phase Signals", IEEE Trans. on Information Theory, vol. IT–28, No. 1, Jan. 1982, pp. 55–67.
R. H. Deng et al., "High Rate Concatenated Coding Systems Using Bandwidth Efficient Trellis Inner Codes", IEEE Trans. on Communications, vol. 37, No. 5, May 1989, pp. 420–427.
IEEE Transactions on Information Theory, vol. 35, No. 1, Janvier 1989, pp. 87–98, Piscatawa, US; G. Pottie et al; "Multilevel Codes Based on Partitioning".
Search Report.

*Primary Examiner*—Stephen Chin
*Assistant Examiner*—Amanda T. Le
*Attorney, Agent, or Firm*—Leroy Eason

[57] ABSTRACT

Apparatus for decoding digital signals, such as digital television signals, which have been transmitted by concatenated coded modulation using partitioning levels of a constellation of points representing different code values. The apparatus includes successive decoding stages which respectively operate on the successive partitioning levels of the constellation. Each decoding stage includes a detector for detecting received points in the relevant partitioning level. At least one stage includes an internal decoder for generating estimated bit sequences in accordance with an inner code and erasures of bit sequences for which the estimation is found to be ambiguous, an external decoder decoding in accordance with an outer code and correcting bit sequence erasures, and an encoder for encoding the output of the external decoder and supplying the resulting re-encoded bit sequences to the succeeding stages of the decoding apparatus to validate detection thereby of points in their partitioning levels. The apparatus may be arranged to produce only a predetermined maximum number of erased bit sequences.

8 Claims, 7 Drawing Sheets

DIGITAL SIGNAL DECODER USING CONCATENATED CODES

BACKGROUND OF THE INVENTION

1. Field of the Invention

The invention relates to a transmission system comprising a transmitter for transmitting digital signals by block-wise encoded modulation in accordance with points of a modulation pattern referred to as a "constellation", and a receiver having a decoder provided with first decoding means ($45_1$–$45_M$) capable of generating bit erasures signifying bit sequence errors and second decoding means ($44_1$–$44_{M1}$) capable of correcting bit erasures and bit sequence errors.

The invention more particularly relates to the transmission of digital television signals, for example high definition television signals, via a satellite channel or over microwave links. It may also relate to the transmission of digital sound signals by mobile radio, or transmission of digital data for storing, for example, on a compact disc, or by a digital tape recorder. In all these cases it is necessary to effect at the source a preliminary bit rate reduction by means of a source encoder, and on reception to reestablish the original bit rate by means of a source decoder. In those cases in which digital data is transmitted between two digital processing units, for example two calculators, bit rate reduction using a source encoder is not required.

Since the most representative use of the invention in high-definition television (HDTV), for which the problems of bit rate reduction are the most extensive, the present application is described with reference to this use but without any limitations as to other suitable uses.

2. Description of the Related Art

Digitizing of High-Definition Television signals (HDTV) generates a total gross data rate of the order of 800 Mbit/sec. The transmission of data at such a rate cannot be realized economically over existing transmission channels. Several coding techniques for reducing the data rate (source coding) have been developed employing coding algorithms which can be evaluated in terms of their data rate "reduction factor" and the quality of the picture obtained after decoding. The more the redundancy of the signal is reduced, the more significant is the actually transmitted information. Transmission errors which can easily be corrected if the information components are redundant, have increasingly serious consequences as the data rate reduction factor increases.

Consequently, the transmission of HDTV digital signals requires judicious error protection. So as to avoid the effects of transmission errors from being noticeable on a display screen, the error rate in the line scanning direction must be less than $10^{-11}$.

The channel which is used for "Direct Broadcasting by Satellite" (DBS) is characterized by:
a bandwidth of 27 MHz;
a low power (above all for the link from the satellite) and the presence of much noise, which is considered to be additive, white and gaussian; and
non-linear distortions.

The routing of digital signals of HDTV via such a channel requires source coding having a considerable compression ratio as well as digital modulation having high spectral efficiency.

Coding techniques based, for example, on an orthogonal transform, can reduce the data rate by a factor higher than 10 whilst still ensuring a good quality of the recovered image. This leads to a binary transmission rate of the order of 60 to 70 Mbits/s. However, the transmission of such signals via a satellite channel requires digital modulation having a spectral efficiency reaching 2.7 bits/s/Hz.

It is further necessary to effect channel coding to protect the transmission from channel imperfections. Conventional channel coding and modulation techniques have proved to be inadequate to satisfy fully the requirements for correct transmission (in these techniques, the coding function is considered to be an entity which is independent of the modulation function). However, these coding techniques are significantly improved with the aid of the coding technique proposed by G. UNGERBROECK in the article: "Channel coding with multilevel/phase signals", published in IEEE Transactions on Information Theory vol. IT-28 no 1, January 1982, pages 55–67.

It is proposed therein to consider the channel coding and the modulation as an integral whole, and to that end to employ channel coding combined with digital modulation. This renders it possible to increase the efficiency of the digital transmission and thus to improve performance without reducing spectral efficiency. The redundancy added by the coding is transmitted as a redundancy of the alphabet instead of by reducing the data rate. This technique is based on the maximization principle of the minimum euclidian distance between sequences of transmitted encoded points.

Thus, after a coding operation which converts p information bits into m bits, wherein m>p and m−p represents the redundancy added for the protection of information components during transmission, using a $2^m$-stage modulation, there are $2^{m-p}$ stages to transmit this redundancy. This modulation technique allows the use of a spatial distribution instead of a temporal distribution of the redundancy.

Following the discovery by G. UNGERBROECK of trellis coded modulations (TCM), combinations of block-wise coded modulations (BCM) and trellis coded multidimensional modulations have been proposed.

TCM's of a moderate complexity (4 or 8 states) can yield a coding gain of 3 to 4 dB. But in large-scale applications the incorporation of a Viterbi decoder, which is required to decode these TCM's, remains expensive in the present state of the art. A coding technique which is attractive for these applications is multilevel coding. The significance of this technique is that it is adapted to a simple sub-optimal decoding method which is effected in stages, and offers a good compromise between the performance and the complexity of the structure.

Based on the constellation partitioning principle described by G. UNGERBROECK, the use of multilevel coding has been analyzed more specifically by G. J. POTTIE and D. P. TAYLOR in "Multilevel Codes Based on Partitioning" IEEE Trans. Information Theor. vol. 35, no. 1, Jan. 1989, pages 87–98.

In that article the authors first analyze the multilevel coding principle, consisting of partitioning a modulation constellation and coding the points of the constellation, and secondly describe a multistage coder having a coding stage assigned to each partitioning level, the points being transmitted block-wise via a transmission channel.

On reception, a multistage decoder effects the inverse operation and recovers constellation points corresponding to the transmitted points. In a conventional decoder this triggers decision operations which estimate points and determine code bits of the estimated points as a function of the detected phase and the amplitude of each point received. Depending on various transmission and receiving conditions, however, a certain number of the estimated bits will be faulty. A first stage of the multistage decoder decides on estimated points according to the first level of the partition. The result supplied by this first stage is employed for validating the decoding of the second stage, and so on until the last stage. In the article by G. J. POTTIE and D. P. TAYLOR, an additional bit erasure operation is introduced after each stage, the decoding effecting a concatenated decoding. This improves the performance of the decoder but at the expense of increased complexity. Actually, this requires the addition of a second decoder to correct and accomplish the bit erasure.

The idea of bit erasure has already been described in another connection by R. H. DENG and D. J. COSTELLO in the article "High rate concatenated coding systems using bandwidth efficient trellis inner codes", IEEE Transactions on Communication, vol. 37, no. 5, May 1989, pages 420–427. Although the term concatenated is used in this article, it actually relates to cascaded codes. To concatenate or cascade two codes an external coder is actually used followed by an internal coder. For concatenated codes, each symbol of the outer code is successively coded by the internal code. For cascaded codes, the internal coder encodes a packet of several symbols of the outer code. These two coding operations require on decoding totally different decoding techniques. Actually, in the case of decoding of concatenated codes, each symbol after decoding is independent of the symbol following it. In contrast thereto, when decoding cascaded codes, the symbols after the decoding operation are dependent and must be processed accordingly. More specifically, coding by cascaded codes requires an interlacer on coding and a deinterlacer on decoding, between the internal and external coder/decoder. This will obviously render the processing operation and hardware realization of the coding and decoding devices more complex. Moreover, as indicated by the aforesaid article, the coding gain obtained, as compared to the technique without erasure, is between 0.05 and 0.1 dB, which is relatively moderate.

SUMMARY OF THE INVENTION

The object of the invention is to improve the performance of conventional decoding by processing information bits whilst maintaining an equivalent complexity of the decoder hardware. The improvement in performance achieves, for a given bit rate error, reducing the necessary signal-to-noise ratio on transmission, which renders it possible to reduce the broadcasting power.

This object is accomplished by providing a system including a decoder which decodes the received points PR originating from the transmitted points of the modulation constellation in accordance with bit assignment at several partitioning levels of the constellation in combination with concatenated inner and outer codes. Such decoder comprises multistage decoding means having a respective stage for each partition level, at least one such state including:

detection means, validated by the stages preceding it, for detecting the received points PR in the partition level of the said one stage, internal decoding means for effecting internal decoding by generating estimated inner code words of the internal code, and effecting erasure of all estimated inner code words for which the estimation decision is ambiguous, external decoding means for effecting an external decoding and which corrects the erasures and errors of the said estimated inner code words, the outputs of the external decoding means being encoded by coders which energize the detection means of the subsequent stages.

Advantageously, a gain in performance is obtained without increasing the hardware complexity of the decoder, for the case, for example, of phase shift keying (PSK) modulation or quadrature amplitude modulation (QAM) of two carriers.

The decoder in accordance with the invention can operate with several types of coded modulations. They may be PSK modulations or QAM modulations or other types of modulations. When PSK is used, the points of the constellation have the same amplitude but differ as regards their phases.

In the case of a PSK-8 modulation, a gain of 0.7 dB has been achieved relative to the conventional techniques. This gain is 7 times higher than the gain obtained by the system described in the above-cited article by R. H. DENG and D. J. COSTELLO.

The internal decoding effects a maximum likelihood decoding of code words having a fixed number of estimated bits, an information portion of each internal code word constituting an external code word symbol, erasure of all the external code word symbols being uncertain.

Thus the decoder benefits from the multilevel coding by putting into effect the partition concept, which is adapted to a simple step-wise sub-optimal decoding method which provides a good compromise between performance and hardware complexity.

The decoder also uses the code concatenation principle, which allows relatively low complexity of the hardware with good performance as compared to an equivalent device using non-concatenated codes.

The erasure method is performed on a fixed number of received points, equal to the number of bits of a code word of the inner code, on the symbols of the outer code, symbol after symbol. This procedure is effected for each external symbol independently of the other external symbols, which achieves much greater decision reliability.

By using a maximum likelihood decoding, the internal decoder provides optimum efficiency. The external decoder benefits from the error correlation at the output of the internal decoder.

The decoder in accordance with the invention does not require the presence of an interlacer at the coding end, and so no deinterlacer is needed at the decoding end. This significantly simplifies the hardware structure.

To enable the decoding operation, the position of a received point in the constellation of the modulation employed must be detected. This constellation is partitioned according to several partition levels, each stage operating for a single partition level.

For each stage the detection means determines, for each received point PR, a pair of distances (D1, D2) between the said received point PR and the two nearest points PT1, PT2 forming part of the sub-assembly of the partition level of the said stage, as well a sequence of bit pairs $b^p{}_1$, $b^p{}_2$ of the same significance p as the bit assignments of the respective points PT1 and PT2.

These bit pairs $b^p{}_1$, $b^p{}_2$ of the same significance p form bit trains arranged in sequences. If the inner code has on transmission a length n, the sequences after decoding constitute inner code words of n bits $b^p$. That is to say, n bits of the same significance p as the n estimated points after detection.

The invention utilizes concatenated codes formed from an inner code represented by a trellis and an outer code in the form of blocks. The trellis furnishes a representation of the inner code, all the possible paths representing points of the constellation which are broadcasted consecutively. The sequences in the trellis code being separated from each other by known junction points of the decoder, the internal decoder of the invention is adapted to:

- calculate for each junction point of the trellis the accumulated distances (D1, D2) on the possible paths of the trellis distributed over the preceding decoded points,
- determine the path having the lowest accumulated distances,
- assign to the bit $b^p$, corresponding to the said junction point a bit of the same significance p as that of $b^p{}_1$ or $b^p{}_2$ of the bit assignment of the point PT1 or PT2 of the last distance (D1, D2) of the accumulation, and when two accumulations for the same junction point are separated by a distance less than a predetermined small distance, adjust the internal code word assembly to the erasure state.

The constellation of an encoded modulation is partitioned into a plurality of levels. Each of the levels is coded and each stage of the decoder then processes a single one of said levels. It is alternatively possible, however, that subsequent stages do not trigger the sequence erasure procedure, this procedure being reserved only for the first partition level. In that case, the decoder further includes a stage provided with the detection means and the internal decoder effects internal decoding by generating estimated code words of an inner code.

It is likewise possible that the last partition levels are not coded. In that case the corresponding stage or stages need only be provided with the detection means which effects, validated by the preceding stages, detection of non-coded received points PR.

Each stage acts in cascade with the stages next to it. For that purpose, the decoded bits of a stage are utilized to effect the decisions in the subsequent stage.

BRIEF DESCRIPTION OF THE DRAWINGS

The invention and its advantages will be better understood with reference to the accompanying drawings, given by way of non-limitative example, in which:

FIG. 1-A is a block circuit diagram of a digital signal coding device,

FIG. 1-B is a block circuit diagram of a digital signal decoding device,

DESCRIPTION OF THE PREFERRED EMBODIMENTS

Figure 1A:
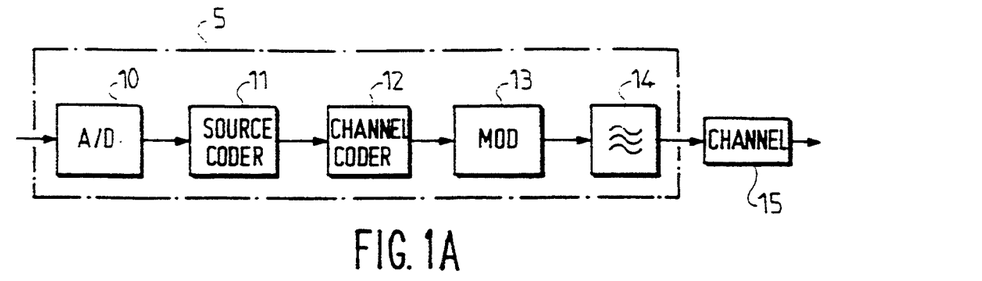

FIG. 1-A shows a block circuit diagram of a digital signal encoder 5 such as is incorporated in the broadcasting portion of a transmission link. It comprises, arranged in series:

- a source 10, for example an analog-to-digital converter, which supplies the digital signals to be coded when they are not already available in the digital form,
- a source coder 11 (which may in some cases be omitted),
- a channel coder 12,
- a modulator 13, and
- a broadcasting filter 14.

The encoder 5 is connected to a transmission channel 15 which may be shortwave links, satellite links or cable links.

When used for the transmission of HDTV signals with a 864 Mbits/s bit rate of video signal samples, this bit rate is compressed to 70 Mbits/s at the output of the source coder 11. These compressed samples are then coded by the channel coder 12 to render them insensitive to imperfections of the channel. Thereafter the modulator 13 modulates the digital signals for transmission over the transmission channel, for example a satellite channel.

Figure 1B:
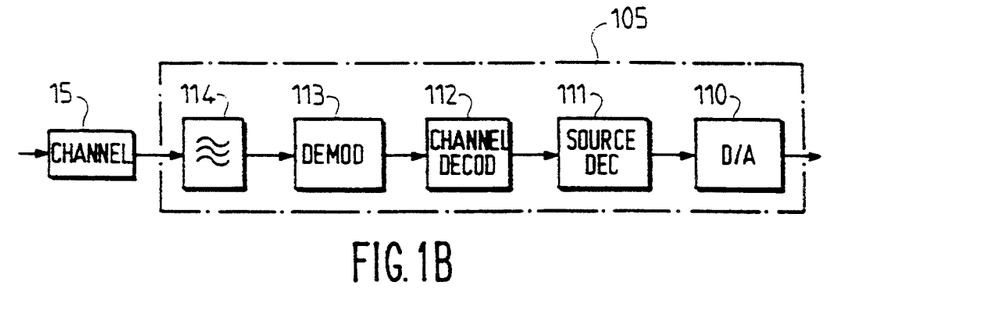

FIG. 1-B shows the block circuit diagram of a decoder 105 at the receiving end which effects operations which are the inverse of the operations effected at the transmitting end. It comprises (arranged at the output of the channel 15):

- a receiving filter 114,
- a demodulator 113,
- a channel decoder 112,
- a source decoder 111 (which may be omitted),
- a digital-to-analog converter 110 when the digital signals are to be corrected to analog form.

The encoder 5, the decoder 105 and the transmission channel 15 constitute a digital signal coding/decoding system with coded modulation.

CODING

The present invention relates to the channel decoding operation, which is the inverse of the channel coding effected at the transmission end of the channel. The channel coding to which the invention relates is multilevel coding. For the sake of clarity the principle of multilevel decoding will first be described.

Figure 2:
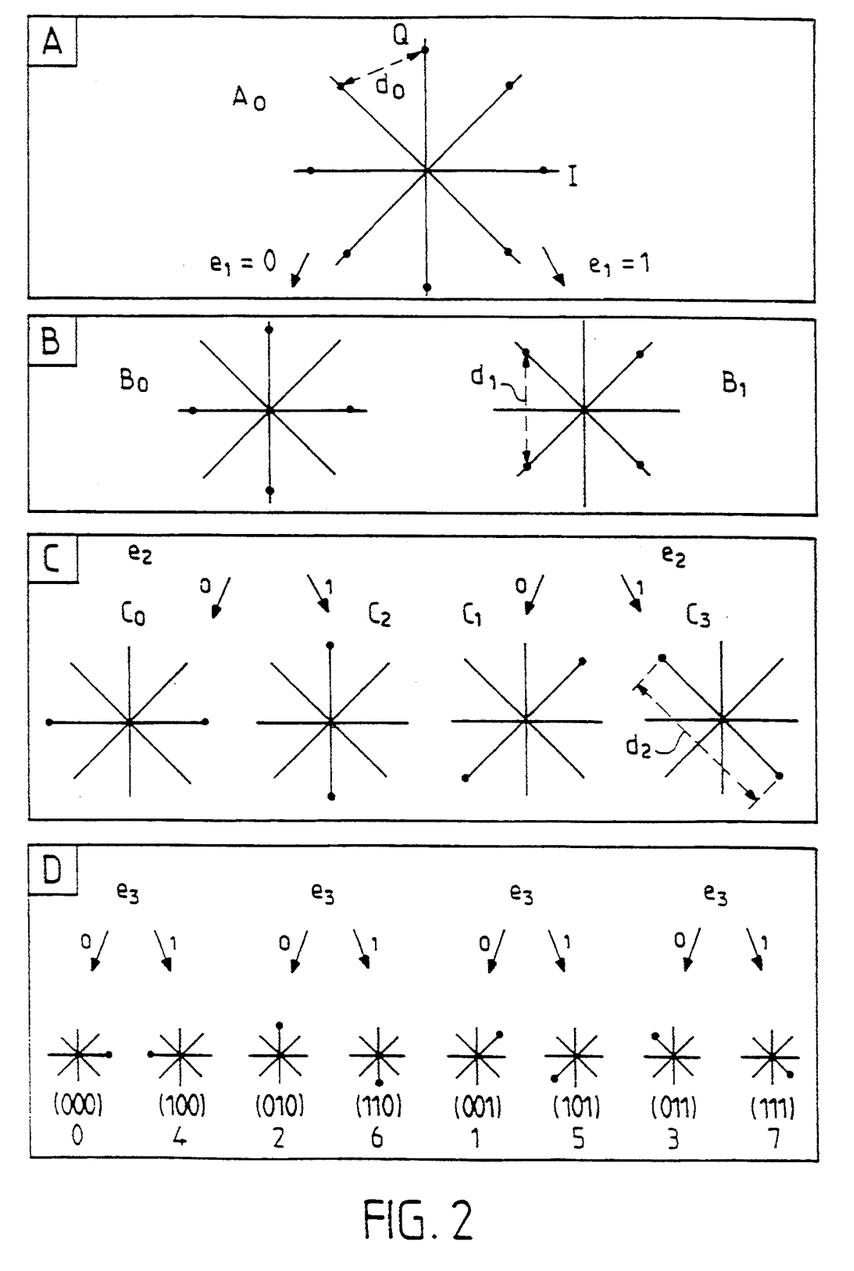
FIG. 2 is a representation of a constellation Ao for PSK-8 modulation, and its three partition levels B, C and D.

Consider (FIG. 2-A) a constellation $A_0$ of $2^m$ points, capable of transmission of m bits per point. If M (wherein $M \leq m$) designates the number of bits to be coded, the constellation $A_0$ is partitioned into M levels thus giving $2^M$ sub-assemblies. The principle of this partition is identical to that in the above-referenced article by G. UNGERBROECK. This principle maximizes the minimum euclidian distance in the sub-assemblies of the partition. If the minimum euclidian distance in the $i^{th}$ partition level is denoted by $d_i$, the following inequality must be verified:

$$d_0 < d_1 < d_2 < \ldots < d_M \quad\quad 5$$

wherein $d_0$ is the minimum distance in $A_0$.

Thus, the M bits $e_1, e_2, \ldots, e_i \ldots, e_M$, (wherein $e_i$ is the bit assigned to the $i^{th}$ partition level) select one of the $2^M$ sub-assemblies, and the m-M remaining bits designate a point in the selected sub-assembly. FIG. 2 gives the diagram of the partitions for a PSK-8 modulation. The constellation $A_0$ (FIG. 2A) having $2^3 = 8$ points is partitioned into a first level (FIG. 2B) having two sub-assemblies $B_0$, $B_1$, each of a minimum distance d1, wherein $e_1 = 0/1$ ($e_1 = 0$ for $B_0$ and $e_1 = 1$ for $B_1$); thereafter (FIG. 2C) into a second level C having four subassemblies $C_1$, ie $\{0,1,2,3\}$, of minimum distance $d_2$, wherein $e_2 = 0/1$ ($e_2 = 0$ for $C_0$ or $C_1$ and $e_2 = 1$ for $C_2$ or $C_3$); and finally into a third level D having 8 sub-assemblies (FIG. 2D). A subassembly in level D is thus a single point. It is thus obtained that $d_0 < d_1 < d_2$.

Figure 3:
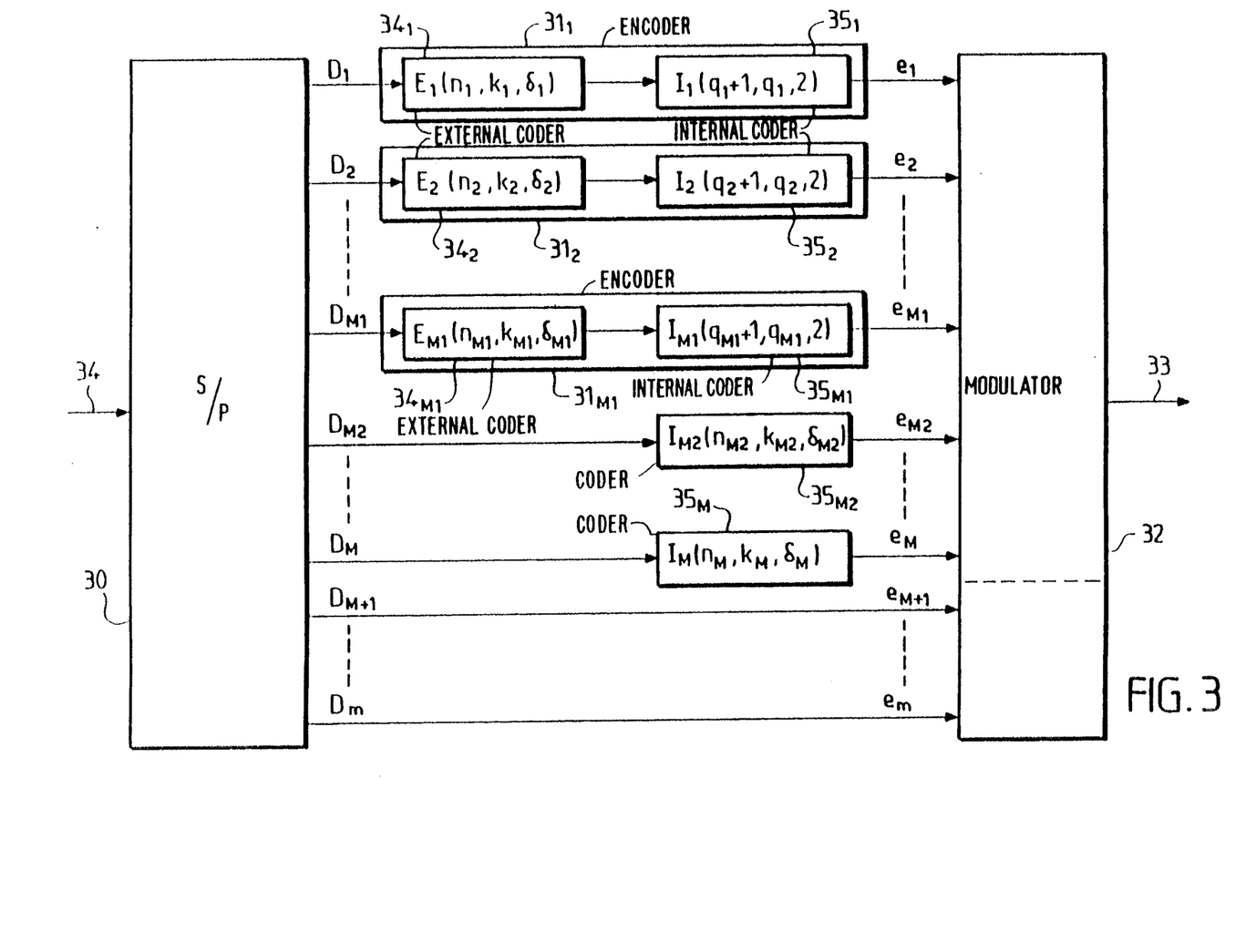
FIG. 3 is a circuit diagram of a multistage coder for concatenated codes.

This method of assigning bits to points of the constellation has for its object to classify the m bits which represent each of the transmitted points as a function of their sensitivity to noise. It is very easy to show that the bit $e_2$ is less sensitive than the bit $e_1$, since the minimal euclidian distance $d_2 > d_1$ corresponds thereto. In accordance with the partitioning principle described in the foregoing, one can demonstrate that if the bits $e_k$, $k \leq i = 1$, are adequately protected to ensure that they are correct, the bit $e_i$, $i \leq M$, is better protected from noise than all the other bits $e_j$, $j < i$ and that the (m-M) last bits are the least sensitive. This implies that it is more prudent to code these bits separately with different codes, rather than to use a conventional series coding wherein all the bits are protected in the same manner from channel noise. The multilevel coding principle consists, after having partitioned the constellation $A_0$ into M levels, in the use of M coders $E_i$, $i = 1, \ldots, M$, to protect these M bits with a plurality of protection levels. The circuit diagram of such a coder is shown in FIG. 3. The data train to be transmitted, (received on line 34) having a rate D is divided by S/P converter 30 into m trains having flow rates $D_i$, $i = 1, \ldots, m$. The first M of such trains are coded by M codes; the subsequent data trans $D_{M+1}$ to $D_m$ are not coded.

Among the M coded bit trains, those from $D_1$ to $D_{M1}$ are coded by the concatenated codes ($E_i$, $I_i$), $E_i$ being a code arranged in blocks $I_i$ being a parity code. The subsequent coded bit trains, after $D_{M1}$ up to $D_M$, are coded by a unique binary coding operation $I_i(n_i, k_i, \delta_i)$.

The codes $E_i(n_i, k_i, \delta_i)$, $i = 1 \ldots M$, have an efficiency $R_i = k_i/n_i$ wherein $n_i$ represents the number of bits transmitted in each block, $k_i$ represents the number of information symbols transmitted in each block, and $\delta_i$ represents the minimum Hamming distance. External coders $34_1$, $34_2$, $\ldots$ $34_{M1}$ effect the coding operations $E_i$. A code symbol $E_i$ is shown over $q_i$ bits.

The parity codes $i$ ($q_{i+1}$, $q_1$, 2) code each symbol of $q_i$ bits supplied by the external coders, by adding a parity bit to them. Internal coders $35_1$, $35_2$, $\ldots$ $35_{M1}$ effect the coding operations $I_i$. This encodes each symbol of the outer code according to an inner parity code, thereby forming the concatenated coding of the two codes $E_i$ and $I_i$.

The $M_1$ bits are encoded by a concatenated coding which supplies their minimum equivalent distances (knowing that $d_i$ represents the distances obtained from the partition, wherein:

$$d_0 < d_1 < d_2 \ldots < d_{M1} \ldots < d_M),$$

$$(dis_1)_i = 2d^2_{i-1}\delta_i, \, i = 1, \ldots M_1.$$

Similarly, the minimum equivalent distances of the bits coded by a unique minimum distance code $\delta$ ($i > M_1$) are:

$$(dis_2)_i = \delta_i d^2_{i-1}, \, i = M_1 + 1, \ldots M,$$

and those distances which are not coded:

$$(dis_3)_i = d^2_{i-1}, \, i = M + 1, \ldots m.$$

The system is optimal when:

$$(dis_1)_i = (dis_2)_i = (dis_3)_i.$$

The outer codes $E_1, \ldots E_{M1}$ may be Reed-Solomon codes over a Galois field CG ($2^{q1}$). That is to say each symbol of the RS is formed by $q_1$ bits.

The inner codes $I_1, \ldots I_{M1}$ may be parity bit codes ($q_11$, $q_1$, 2).

Assuming that all the codes $E_i$ are of the same length, wherein $n_i = n$ and $q_i = q$, and that the M codes $E_i$ are codes in blocks, this coding can be described by a matrix structure identical to that used for block-wise coded modulation. A code word corresponds to n(q+1) points of the constellation, and can be represented by a binary matrix G having m lines and n(q+1) columns, wherein the $j^{th}$ point of the block and the $i^{th}$ line represent the bits assigned to the $i^{th}$ partition level. The line i, $i = 1, \ldots, M_1$ is a concatenated code word, and the (m-M) last lines contain either non-coded bits or bits coded by a unique inner code. With, for example, three partition levels for the case of a PSK-8 modulation we have:

$$G = \begin{vmatrix} e_1^1 e_1^2 & \ldots & e_1^i e_1^{i+1} & \ldots & e_1^{n(q+1)} \\ e_2^1 e_2^2 & \ldots & e_2^i e_2^{i+1} & \ldots & e_2^{n(q+1)} \\ e_3^1 e_3^2 & \ldots & e_3^i e_3^{i+1} & \ldots & e_3^{n(q+1)} \end{vmatrix}$$

The bits of a column, for example $e^1_1$, $e^1_2$, $e^1_3$, form a point $r^1$.

The multilevel coding circuit (FIG. 3) includes a series-parallel converter 30 which converts the series data having flow rate D into parallel bit trains having flow rates $D_1$, $D_2 \ldots D_m$. The first $M_1$ bit trains are encoded by encoders $31_1$, $31_2 \ldots 31_{M1}$ which derive the binary coded data words $e_1$, $e_2 \ldots e_{M1}$. Such encoding includes concatenated coding by the external coders $34_1$ to $34_{M1}$ and the internal coders $35_1$ to $35_{M1}$. The succeeding bit trains $D_{M2}$ to $D_M$ are encoded only by the unique binary coding $I_i$, resulting in the binary coded data words $e_{M2} \ldots e_M$. The bit trains $D_{M+1} \ldots D_m$ are not encoded at all, and form data words $e_{M+1} \ldots e_m$. For each word ($e_1, e_2, \ldots e_m$) the bit assignment of a point of a modulation constellation containing $2^m$ points is transmitted by the modulator 32 over the connecting line 33.

By way of example, in the case of a PSK-8 modulation constellation, wherein m=M=3, the encoding of the first level (1st stage) can be a concatenated coding formed by:

code $E_1 = RS (40, 34, 7)$ on a 256-point Galois field, the number of bits of a symbol being $q_1 = 8$, and a code $I_1$ = parity ( 9, 8, 2 ).

Coding the second level (2nd stage) is effected by a parity code:

$I^2$ = Parity (20, 19, 2).

The third level (3rd stage) is not coded.

The matrix is then present in the shape:

| 8 | 1 | 8 | 1 | ... | 8 | 1 |
|---|---|---|---|-----|---|---|
|   | 19 |   | 1 | 19 | 1 |   |
|   |   |   | 360 |   |   |   |

A point of the PSK-8 constellation is represented by a column of this matrix. A block is then formed by 360 consecutive points.

DECODING

The decoding operation is the inverse of the coding operation. A detection is performed in each stage of each of the levels of the partition. A concatenated decoding is effected for the stages in which concatenated coding has been performed. After each detection in a sub-assembly of the partition, each stage effects two decoding operations (internal decoding and external decoding).

Figure 4:
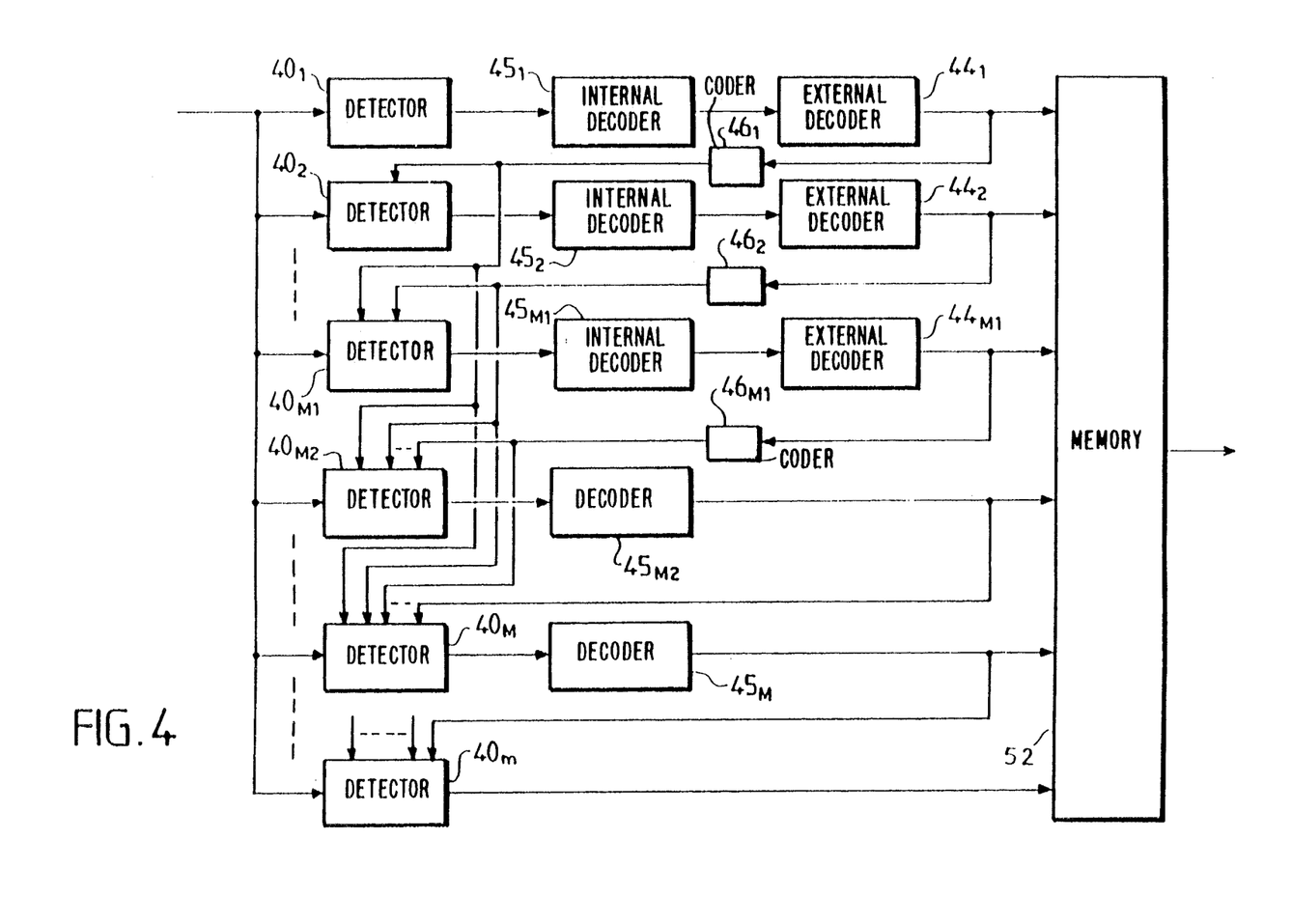
FIG. 4 is a circuit diagram of a multistage decoder for concatenated codes.

FIG. 4 shows a general circuit diagram of a multi-stage decoder having certain stages which operate on concatenated codes. Detectors $40_1 \ldots 40_{M1}, 40_{M2} \ldots 40_M \ldots 40_m$ each effect detection in a partition level. For the stages i = 1 to $M_1$ the decoders $45_1, 45_2 \ldots 45_{M1}$ perform internal maximum likelihood decoding operations. These internal decoders supply internal, deleted or non-deleted code words, respectively, to external decoders $44_1, 44_2 \ldots 44_{M1}$. The internal decoders cancel the redundancy resulting from internal coding of each point. The external decoders thereafter supply estimations of the bit sequences.

To estimate a level i, estimations effected in the preceding levels are taken into account. To that end, the information components estimated by the level i−1 are again coded by coders $46_1, 46_2 \ldots 46_{M1}$ to find again the redundancy of the internal code words. This is necessary to obtain code words of length $n(q+1)$ bits required for the subsequent stages.

For the stages for which there is only one type of internal coding ($i = M_2$ to $M$), only one detection and a maximum likelihood decoding are effected.

For the stages in which there is only one type of internal coding (i = M+1 to m), only one detection is effected. The output data are entered into a memory 52.

Figure 5:
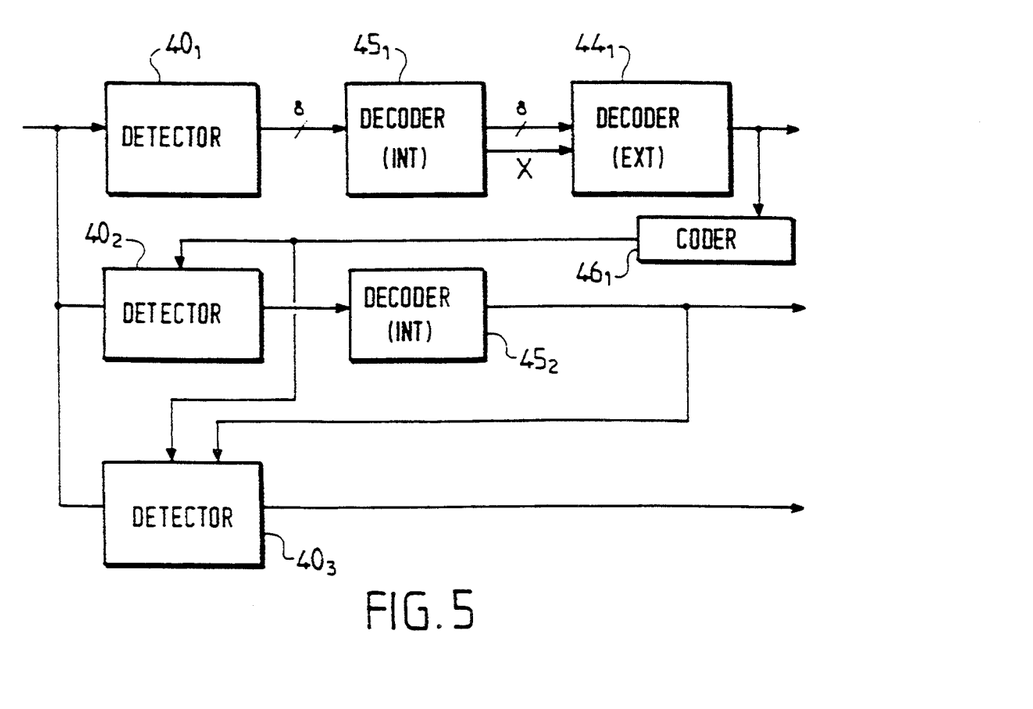
FIG. 5 is a circuit diagram of a multistage decoder having two error protection stages.
Figure 6:
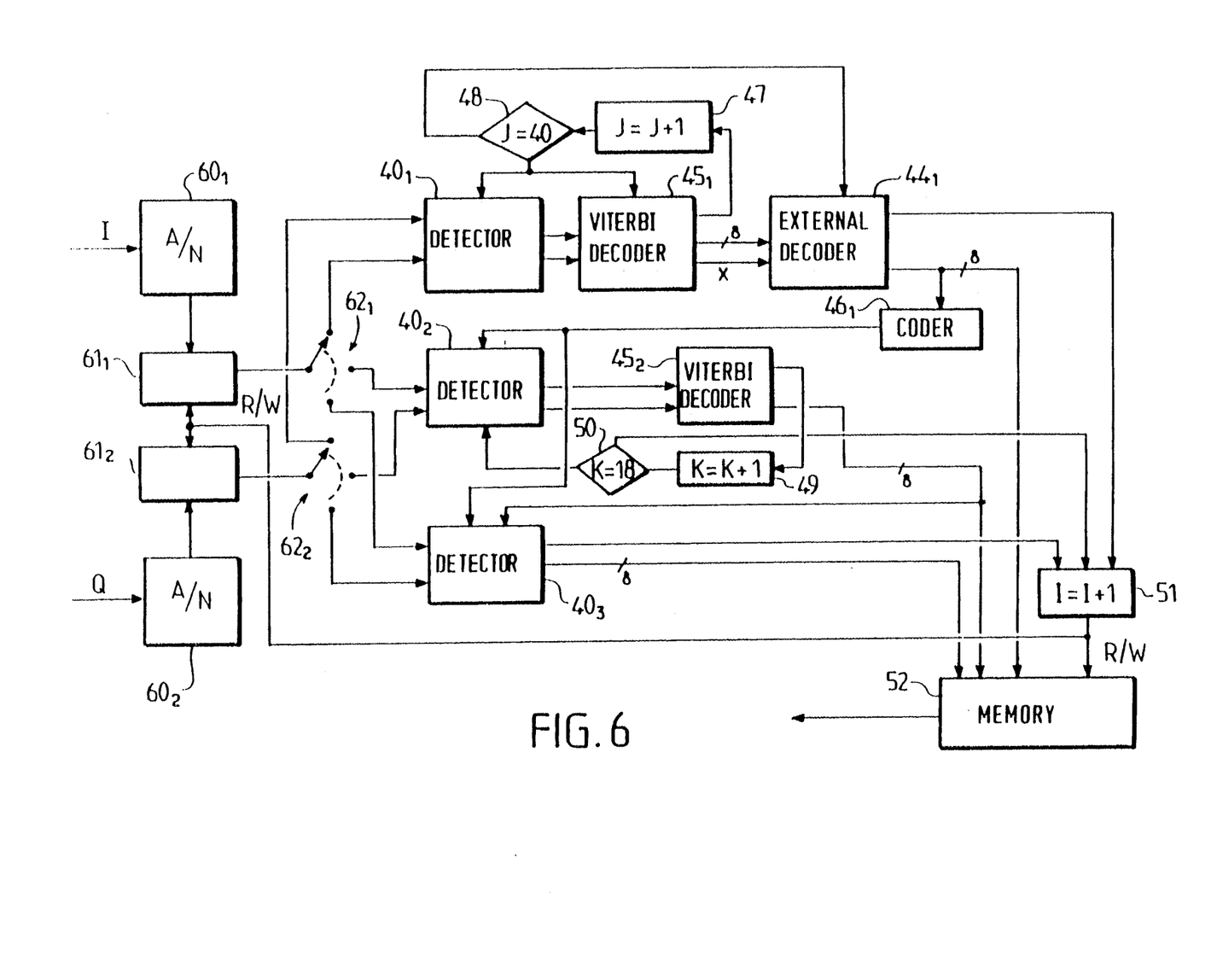
FIG. 6 is a detailed circuit diagram of the decoder of FIG. 5.

By way of example, the FIGS. 5 and 6 represent a multistage decoding operation for decoding concatenated codes using a PSK-8 modulation. In FIG. 5:

the first stage comprises a detector $40_1$, an internal decoder $45_1$, and external decoder $44_1$ and an encoder $46_1$ (concatenated coding), the second stage comprises a detector $40_2$ and an internal decoder $45_2$ (simple coding), the third stage comprises a detector $40_3$ (no coding).

The first stage decodes an external code RS (40, 34, 7) concatenated with an internal parity code (9, 8, 2).

The second stage decodes an internal parity code (20, 19, 2).

A transmitted block S contains 360 points of the constellation $S = (s_1 \ldots s_{360})$.

A received block R also contains 360 received points:

$R = (r_1 \ldots r_{360})$.

The received block R contains noise which causes a detection uncertainty. A detailed circuit diagram of the decoder is shown in FIG. 6. The received signals, modulated in phase I and in quadrature Q, are digitized by analog-to-digital converters $60_1, 60_2$ which are followed by respective memories $61_1, 61_2$ which store the digitized data so as to allow it to be processed block-wise. Change-over switches $62_1, 62_2$ distribute the digitized data successively over the three stages, so as to provide that the stages act one after the other on the same data blocks.

First Stage

The first stage effects a first estimation in the detector $40_1$. To that end, it detects a received point P and positions it in the constellation PSK-8 shown in FIG. 7. A point of the constellation PSK-8 is coded over three bits. The first stage of the detector determines the least significant bit, the second stage determines the middle significant bit and the third stage determines the most significant bit. The first stage thus supplies sequences of least significant bits.

Figure 7:
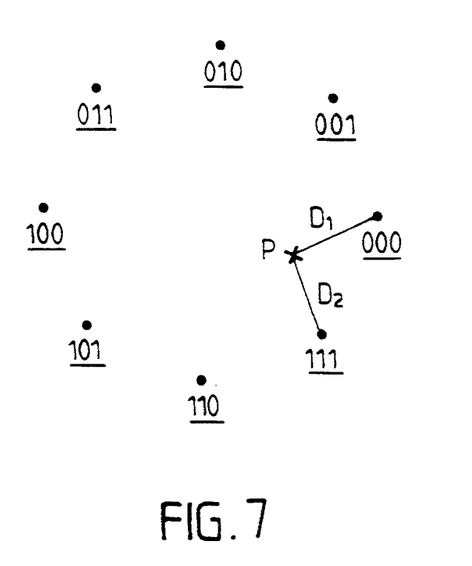
FIG. 7 is a representation of a constellation for PSK-8 modulation and with a received point P.

To estimate the bits for the point P, the detector $40_1$ calculates two distances $D_1$ and $D_2$ with respect to the two points of the constellation PSK-8 which are nearest to the received point P. Such a detection is effected for a sequence of received points, in this case 9 points taking into account the external decoder used. The detector $40_1$ thus supplies sequences of 9 pairs of estimated bits as well as the corresponding distances $D_1$ and $D_2$. For each sequence of 9 bit pairs corresponding to 9 received points, the Viterbi decoder $45_1$ utilizes these data and determines the unambiguous or ambiguous quality of each internal code word. The Viterbi decoding is a maximum likelihood decoding which uses the trellis of the code made operative by the coder.

Figure 8:
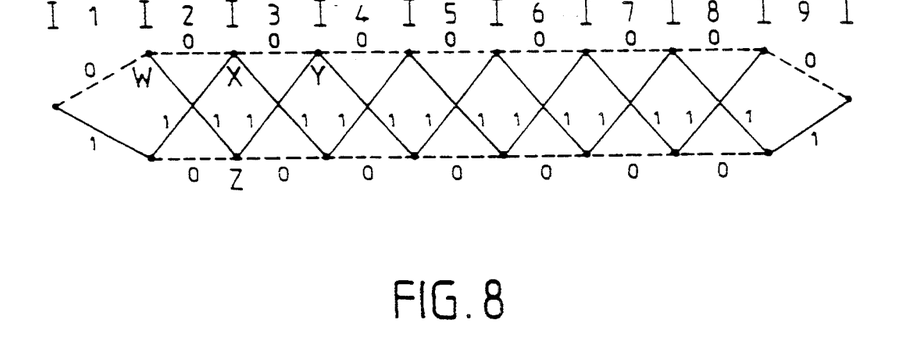
FIG. 8 is a representation of the trellis of an inner code.

The trellis of the internal code is shown in FIG. 8 for a sequence of 9 received pints. The black dots in FIG. 8 represent the junction points of the trellis. The broken lines correspond to the 0 bits and the solid lines correspond to the 1 bits. A path ending at a junction point Ni of the trellis consequently represents the state of the decisions effected on the i−1 preceding points of the modulation.

The maximum likelihood decoding will consist in determining for, for example, a junction point Y, the possible paths in the trellis taking into account the preceding points already decoded. Thus, for the junction point Y (FIG. 8), there may be the paths W X Y or W Z Y. A metric value is calculated corresponding to the accumulations of the distances $D_1$, $D_2$ determined for each preceding point, and the path having the lowest metric value is selected as the most likely path. Then, at the junction pint Y, the decoder assigns to the bit of the point received either a 0 bit or a 1 bit depending on the selected path. This determination is effected in the same manner at each junction point of the trellis of a sequence.

However, situations may arise in which the accumulations calculated for two different paths are very near to each other and so ambiguities occur. In this case, an estimation is not effected if the deviation between two accumulations is less than a predetermined deviation. The sequence is then adjusted to the "erasure state". It is said to be "eliminated". This comparison between the metric values of different paths is only performed once in a sequence, and is evidenced by an erasure each time of only one single sequence, a sequence corresponding to a symbol of the external code.

This mode of operation could not be used with cascaded codes, which can only act on a plurality of sequences at one and the same time without the necessity that their number be a priori limited. Actually, with cascaded codes erasures may occur for a large number of sequences, which significantly complicates the decoding and result in very limited decoding reliability.

When a sequence is eliminated in accordance with the invention, an ambiguity is thus created for the totality of bits of the sequence. This ambiguity is thereafter eliminated by the external decoder $44_1$ (FIG. 6).

The Viterbi decoder $45_1$ thus supplies sequences of 9 bits, of which 8 bits represent the coded information, and erased sequences. An external code word correspond to 40 sequences of 8 bits, i.e. 320 bits. The external decoder, which may be a Reed-Solomon decoder, acts on 8×40 bits, so 320 bits, and provides the bits estimated by the first stage, i.e. 40 sequences of 8 information bits.

A counter 47 determines the number J of processed internal code words. A comparator 48 renders it possible to continue the detection (block $40_1$) and processing of the Viterbi decoder (block $45_1$) when J<40, and to validate triggering of the external decoder 44 when J=40.

Second Stage

The second stage needs the parity bits produced by the first stage for its operation. The parity bits are extracted by the first stage. They must be reintroduced into the 40 sequences before such sequences are introduced into the second stage. A parity coding I (9, 8, 2), effected by the coder $46_1$, enables this.

The sequences of 40×9 bits thus recovered enable the second detector $40_2$ in FIG. 6 to determine the second partition level, $B_0$ or $B_1$, to be taken into account for the detection. The Viterbi decoder $45_2$ thereafter effects a decoding over 20 bits corresponding to 20 points received in accordance with the example chosen for the coding.

A counter 49 and a comparator 50 render it possible for the preceding stage either to continue the processing per stage if the number of internal code words has not yet been reached, or to put the subsequent stage into operation if said number has been reached.

Third Stage

Since the third transmitted partition level has not been coded, there only needs to be a detection in this third partition level with the aid of the detector $40_3$. The output of the Viterbi decoder $45_2$ in the second stage is entered into the detector $40_3$ to enable this detection.

A counter 51 is incremented by one unit each time a stage becomes operative, and supplies a R/W signal when all the stages have finished their processing operation. This signal renders it possible to enter the results of all stages into a memory 52 which supplies the decoded data. The signal R/W triggers writing of new received data into the memories $61_1$, $61_2$.

Figure 9:
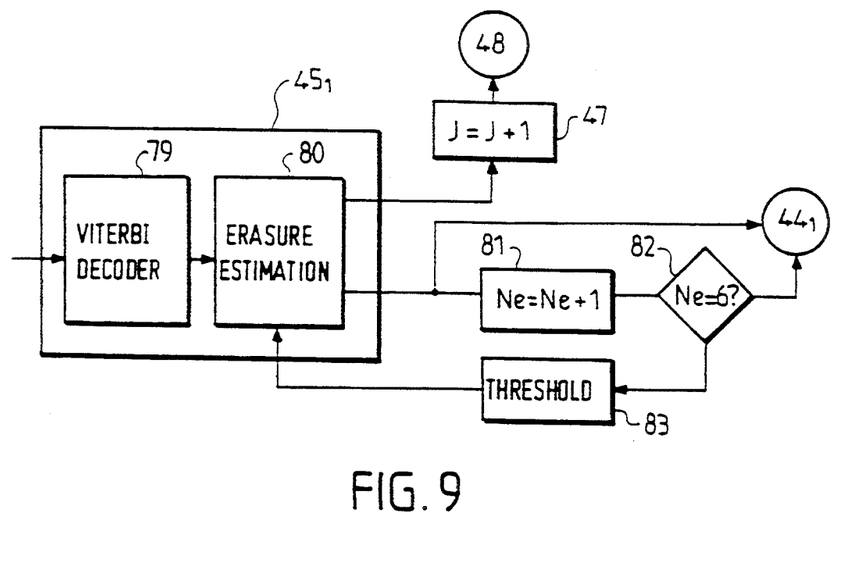
FIG. 9 is a circuit diagram of a Viterbi erasure decoder with an adaptive estimation.

FIG. 9 illustrates the circuit diagram of the erasure Viterbi decoder $45_1$, and is constituted by a Viterbi decoder 79 proper and an erasure estimator 80. As has been indicated in the foregoing, when two metrical values (accumulated distances) relating to two paths are only separated by a distance $\epsilon$, the corresponding sequence is erased. In accordance with an adapted embodiment, the value of this distance $\epsilon$ can be modified.

A counter 81 counts the number Ne of erased sequences. This number Ne is compared in a comparator 82 to a predetermined value, for example Ne=6 in the present example. If the number of erased sequences is less than or equal to 6, decoding by the decoder $44_1$ continues as indicated hereinbefore. If the number of erased sequences exceeds 6, the comparator modifies the step $\epsilon$ (block 83) which acts on the erasure by estimating once again the same sequence of points received.

Figure 10:
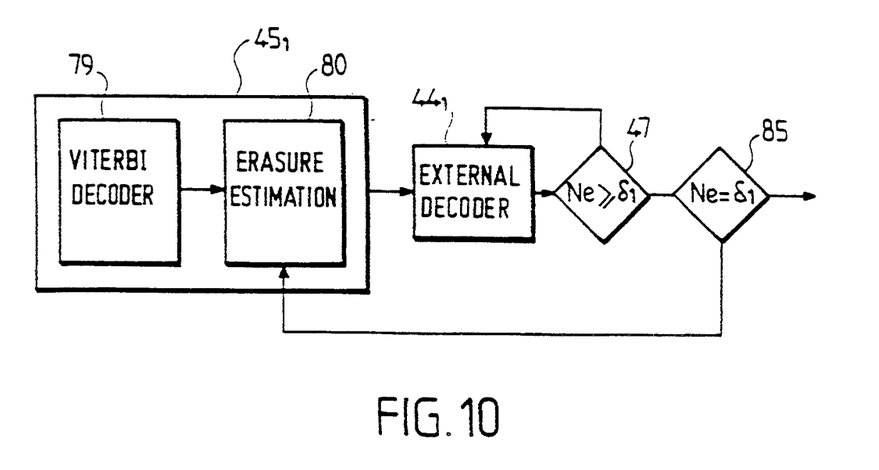
FIG. 10 is a circuit diagram of a Viterbi erasure decoder with a further adaptive estimation.

It is likewise possible to implement the invention using a different adaptation mode. This may be combined or not combined with the previous adapted embodiment. This different adapted embodiment is shown in FIG. 10. The erasure Viterbi decoder $45_1$ comprises a Viterbi decoder proper and an erasure estimator 80.

Connected to the output of the erasure Viterbi decoder $45_1$ is the external decoder $44_1$ which corrects the erasures. Its correction capacity is limited to a number of $\delta_1 - 1$ erasures. It can, for example, correct $N_e$ ($N_e \leq \delta_1 - 1$) erasures, wherein $\delta_1$ is the Hamming distance of the external code. If the number of erasures exceeds ($\delta_1 - 1$), it then delivers an incorrect result, that is to say the erasures are not corrected. According to the invention, it is possible to increase the correction capacity of the external decoder to exceed ($\delta_1 - 1$), for up to $\delta_1$ erasures. To that effect, there is provided at the output of the external decoder $44_1$ a test unit 47 which determines whether the external decoder $44_1$ is beyond its correction capacity ($N_e \geq \delta_1$). Such a determination is made when the number of erasures to be corrected is equal to $\delta_1$ (counter 85). In that case the external decoding is not effected by placing the internal code word in the erasure mode, but by utilizing the internal code words $C_1$ or $C_2$ which relate to either the point D1 or the point D2, respectively, detected for the junction pint under consideration. In this situation it is actually very possible for the correct internal code word to correspond to that of the point D1 or the point D2. Therefore, when the number $N_e$ of erasures reaches $\delta_1$, the external decoder $44_1$ in FIG. 10 operates in the first place by replacing the erasure by the code word $C_1$. If the result is poor, that is to say when the code word $C_1$ has a greater Hamming distance than the code word $C_2$, the erasure is instead replaced by the code word $C_2$. This adaptive mode can deliver improved results for certain internal and external concatenated codes.

We claim:

1. Apparatus for decoding a received digital signal representing a series of modulated code words each of which has been formed by concatenated encoding of one or more of the symbols in a corresponding information word in accordance with an inner code and an outer code and modulation of the resulting encoded information word in accordance with modulation values corresponding to points in successive partitioning levels of a constellation of modulation values; said decoding apparatus comprising successive decoding stages for the successive partitioning levels of said constellation, each decoding stage including detection means for receiving the digital signal and deriving therefrom bit sequences corresponding to points in the relevant partitioning level of said constellation, at least one of said decoding stages further comprising:
  internal decoding means for decoding the bit sequences derived by said detection means by estimating in accordance with said inner code, so as to derive estimated inner decoded bit sequences, said decoding including erasure of inner decoded bit sequences for which the estimation decision is ambiguous;

external decoding means for receiving the inner decoded bit sequences and erasures from the internal decoding means and decoding in accordance with said outer code so as to derive outer decoded bit sequences, the outer decoded bit sequences including correction of said erasures;

encoding means coupled to said external decoding means for re-encoding the outer decoded bit sequences and supplying the re-encoded bit sequences to the detection means of all decoding stages succeeding said one decoding stage, the re-encoded bit sequences enabling the detection means in said succeeding decoding stages to validate that the bit sequences derived thereby correspond to points in the relevant partitioning levels of said constellation; and storage means coupled to all of said decoding stages for combining the outer decoded bit sequences derived by said at least one decoding stage with bit sequences derived by the remaining decoding stages, the combined bit sequences constituting successive decoded information words corresponding to successive modulated code words of the received digital signal.

2. Decoding apparatus as claimed in claim 1, wherein said internal decoding means performs a maximum likelihood decoding to derive estimated inner decoded bit sequences having a predetermined number of bits, an information portion of each inner decoded bit sequence constituting a symbol in said outer code, erasure of the entire information portion of an inner decoded bit sequence being performed when the estimation of at least one bit of said sequence is ambiguous.

3. Decoding apparatus as claimed in claim 1, wherein the detection means in each decoding stage is adapted to determine, for detecting whether a bit sequence corresponds to a received point (PR) which is within a particular sub-assembly of the relevant partitioning level of said constellation:

a pair of distances (D1, D2) between the received point (PR) and two nearest points (PT1, PT2) included in said subassembly; and a series of binary bit pairs ($b_1^p$, $b_2^p$) of the same binary significance (p) as the bits represented by said two nearest points (PT1 and PT2).

4. Decoding apparatus as claimed in claim 3, wherein the internal code is a trellis code, the points of said constellation as represented in the trellis code are separated from each other by junction points, and for decoding a received point (PR) said internal decoding means is adapted to:

calculate for each junction point of the trellis the accumulated distances (D1, D2) over different possible paths of the trellis as distributed over preceding decoded received points;

determine the one of said paths for which said accumulated distances is a minimum;

for each accumulation, assign to a bit ($b^p$) corresponding to said junction point the same binary significance (p) as that of the bits represented by the two nearest points (PT1 and PT2) corresponding to the last of the distances (D1, D2) included in said accumulation; and when two of said accumulations for any junction point differ by less than a predetermined small distance, perform an erasure of the entire inner decoded bit sequence which corresponds to the received point (PR).

5. Decoding apparatus as claimed in claim 4, wherein said external decoding means has a capacity to correct only up to a predetermined maximum number of erased bit sequences, and said internal decoding means comprises means for adapting said predetermined small distance to a value such that the number of erased bit sequences does not exceed said maximum number.

6. Decoding apparatus as claimed in claim 5, wherein said external decoding means further comprises means for increasing said correcting capacity to one more than said maximum number.

7. Decoding apparatus as claimed in claim 1, wherein at least a further one of said decoding stages only produces bit sequences which correspond to constellation points which relate to information word symbols which are only encoded in said inner code, so that said further decoding stage does not require and does not include any external decoding means.

8. Decoding apparatus as claimed in claim 1, wherein at least a still further one of said decoding stages only produces bit sequences corresponding to constellation points which relate to information word symbols which are not encoded in either of said inner and outer codes, so that said still further decoding stage does not require and does not include any internal or external decoding means.

* * * * *